(12) United States Patent
Swaminathan et al.

(10) Patent No.: US 6,574,287 B1
(45) Date of Patent: Jun. 3, 2003

(54) FREQUENCY/PHASE COMPARISON CIRCUIT WITH GATED REFERENCE AND SIGNAL INPUTS

(75) Inventors: Ashok Swaminathan, Ottawa (CA); Mark Miles Cloutier, Aylmer (CA); James Andrew Cherry, Ottawa (CA)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/491,875

(22) Filed: Jan. 27, 2000

(30) Foreign Application Priority Data

Jan. 27, 1999 (CA) .............................................. 2260456

(51) Int. Cl.⁷ ............................................. H04L 27/06
(52) U.S. Cl. ...................... 375/320; 375/327; 375/375; 375/376; 329/347; 327/159; 455/260
(58) Field of Search ................................. 375/376, 375, 375/316, 327, 344, 320, 373; 327/156, 159, 155; 329/347; 455/260

(56) References Cited

U.S. PATENT DOCUMENTS

| | | | | |
|---|---|---|---|---|
| 3,626,426 A | * | 12/1971 | Steinberg | 331/2 |
| 4,063,169 A | * | 12/1977 | Palmer | 324/76.14 |
| 4,155,105 A | * | 5/1979 | Braun | 360/51 |
| 5,432,827 A | * | 7/1995 | Mader | 331/2 |
| 6,060,953 A | * | 5/2000 | Tsai | 331/1 A |
| 6,295,327 B1 | * | 9/2001 | Takla | 327/147 |

* cited by examiner

Primary Examiner—Amanda T. Le

(57) ABSTRACT

Disclosed is a frequency-locked loop (FLL), which attempts to bring about frequency and phase synchronization between two signals over the control bandwidth of the loop: a reference signal and a voltage-controlled oscillator (VCO) signal. For example, the FLL employs a reference signal generated by a crystal oscillator of frequency $f_{REF}$ and a VCO signal generated by the oscillations of an unquenched SRG resonator with tunable resonant frequency $f_{RES}$. These signals are connected to the inputs of a phase/frequency detector (PFD) which produces output pulses in response to the relationship between $f_{REF}$ and $f_{RES}$. These pulses are applied to a loop filter (LF) which creates a voltage using some kind of charge-storage element. This loop filter voltage is a so-called error voltage whose value is used to control the frequency of the resonator to bring the reference signal and VCO signal into phase synchrony.

25 Claims, 4 Drawing Sheets

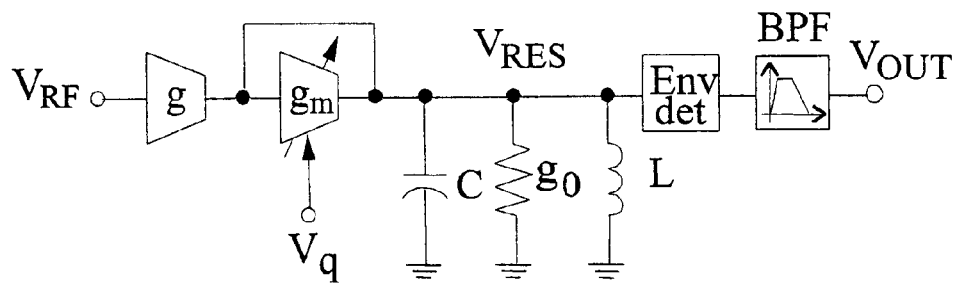
Fig. 1 *(Prior Art)*
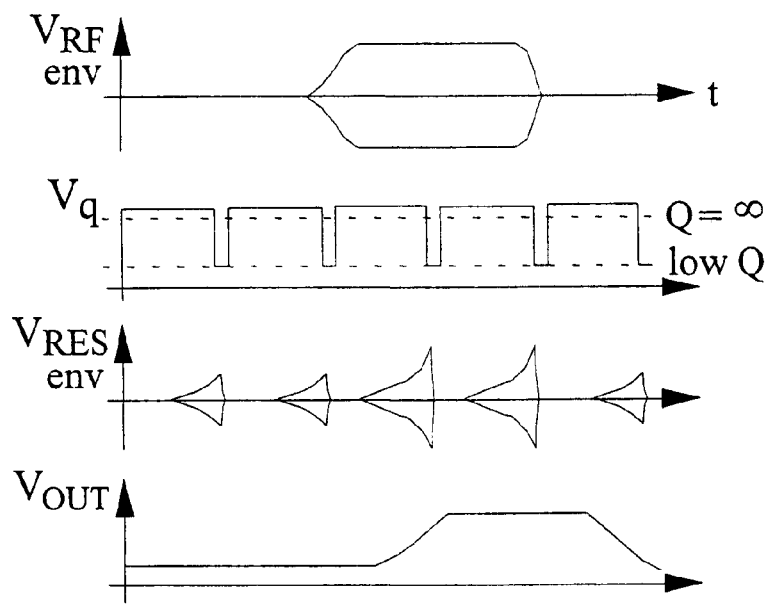
Fig. 2 *(Prior Art)*

FREQUENCY/PHASE COMPARISON CIRCUIT WITH GATED REFERENCE AND SIGNAL INPUTS

FIELD OF THE INVENTION

The invention relates to automatic frequency comparison and/or control (AFC) of a phase/frequency of a signal with that of a reference. In a particular embodiment, it is directed to a novel frequency-locked loop architecture which uses gated input and reference signals.

BACKGROUND OF THE INVENTION

The AFC of the invention will be described in connection with a superregenerative (SRG) radio receiver, though the invention should find other AFC applications. SRG radio receivers are used widely for reception of RF (radio frequency) signals because of its circuit simplicity and exceptionally high signal sensitivity. SRG radio receivers require a stable tuned circuit which is realized by the used of some kind of AFC. It should be noted that frequency and phase can be used interchangeably and the invention can be described by using in either term. It is however decided that "frequency" is used throughout the present specification.

A block diagram of a simple SRG receiver is depicted in FIG. 1. The input signal $V_{RF}$ is an RF signal at a fixed frequency $f_{RF}$ which is modulated with amplitude-shift keying (ASK); digital data is often transmitted as binary data. $V_{RF}$ is connected to some kind of resonant circuit with natural center frequency $f_{RES}$. This resonant circuit is connected to some kind of Q control circuit such that overall resonator Q is variable, controlled by a deterministic signal $V_q$. In FIG. 1, the resonant circuit is an LC tank circuit with the parallel conductance $g_0$ representing losses in the passive components, i.e., finite tank Q, and a transconductor $g_m$ configured as a tunable negative resistor, but other kinds of circuit (e.g., a ring oscillator) are possible. The resonator output voltage $V_{RES}$ is connected to an envelope detector followed by a band pass filter (BPF), the combination of which produces a voltage $V_{OUT}$ which contains the demodulated data.

Operation of the SRG receiver just described is as follows. The Q control circuit is driven with a periodic voltage (period $T_q$, frequency $f_q=1/T_q$) such that for the majority of the period, the resonator is made very slightly unstable. VRES begins to oscillate, building in amplitude with an envelope whose shape is exponential; if left to build for a sufficient period of time, the shape ceases to be exponential because it eventually succumbs to an amplitude limiting mechanism. Usually such a mechanism is inherent to the SRG, for example nonlinearity in the Q control circuit or finite power supply voltage. For the remaining small portion of $T_q$, the Q control is driven such that the resonator is very stable, to the point that any built-up oscillations rapidly die out and $V_{RES}$ falls to near zero. This is known as "quenching the oscillation". The quench frequency must be at least twice the data rate as the quenching is a form of sampling of the data and the sampling rate is governed by normal Nyquist restrictions.

The method of data detection at $V_{RF}$ works as follows. During the portion of $T_q$ when $V_{RES}$ is permitted to oscillate, the oscillations commence because of wideband thermal noise inherent to any practical electrical system; this creates a nonzero voltage on $V_{RES}$, and positive feedback inside the resonator passband ensures noise components at frequencies close to $f_{RES}$ are amplified more than those at other frequencies. As a result, the frequency of the built-up oscillation immediately prior to quenching is the same as the natural center frequency of the resonator. If there is coherent energy at the RF input $V_{RF}$ (i.e., a carrier) that falls within the passband of the resonators then the build-up of resonator oscillations is encouraged: the initial voltage at $V_{RES}$ has a larger magnitude than it would if only noise were present. The time constant of the exponential build-up is determined by the setting of $V_q$ alone, and so it is the same whether or not passband energy on $V_{RF}$ is present; the more energy present on $V_{RF}$, therefore, the greater the final amplitude of the oscillation. Thus, the energy build-up on $V_{RES}$ is proportional to the passband power on $V_{RF}$ and an envelope detector/BPF combination is sufficient to generate a signal proportional to this latter quantity. The envelope detector maintains the subcarrier position of the data relative to the carrier while translating the modulated signal to baseband. Hence, unmodulated signals translate to dc and are rejected by the baseband BPF, while the data pass through the BPF. Of course the BPF must be appropriately matched to the data frequency.

FIG. 2 illustrates typical waveforms and waveform envelopes during the operation of the receiver, all being time coordinated. $V_q$ represent a periodical control signal for quenching. $V_{RES}$ envelope shows exponential build-ups and decays of oscillation amplitude.

Usual embodiments of SRG receivers use a resonator with a fixed center frequency. They require this center frequency to be set fairly precisely because the resonator passband is very narrow during operation (this improves sensitivity to weak RF signals). Component tolerances are often sufficiently poor that $f_{RES}$ can only be set with enough accuracy via mechanical means (for example, trimming the value of a tunable capacitor by hand) prior to first use of the receiver. Thereafter, $f_{RES}$ cannot be changed over the life of the circuit unless it is recalibrated. Manual setting of the resonator frequency is error-prone and expensive; more seriously, $f_{RES}$ might drift after calibration, for example, due to component aging or temperature variations. As noted above, the $V_q$ control is operated such that when the resonator is made to oscillate, the band of frequencies to which the oscillator is sensitive is very narrow; even a slight frequency drift can be enough to mean the transmitted data on $V_{RF}$ is no longer within the resonator passband, which means the SRG receiver is no longer capable of receiving the data.

The present invention addresses these problems by the use of the automatic phase/frequency control in general. Its basic concept is applicable to a variety of areas in which phase/frequency control is needed. The invention, however, is described in detail in connection with the SRG in which the resonator center frequency is made tunable (for example, by replacing the capacitor in an LC-based resonator with a varactor), and the AFC of the invention is provided for adjusting $f_{RES}$ with no external mechanical control. Moreover, the invention provides a means of controlling $f_{RES}$ during receiver operation so that the center frequency is held fixed, even in the face of mechanisms which would otherwise cause the frequency to drift.

Other advantages, objects and features of the present invention will be readily apparent to those skilled in the art from a review of the following detailed description of preferred embodiments in conjunction with the accompanying drawings and claims.

SUMMARY OF THE INVENTION

Briefly stated, the invention is directed to a frequency comparison circuit for comparing frequencies of a variable signal and a reference signal. The frequency comparison circuit includes a phase frequency detector for comparing frequencies of the variable signal and the reference signal and for generating an output that depends upon the relationship of the frequencies; and gate modules at the inputs of the phase frequency detector for gating the variable signal and the reference signal so that only a portion of the variable signal and reference signal are repetitively applied to the inputs of the phase frequency detector for processing.

In accordance with another aspect, the invention is directed to a frequency lock loop circuit for maintaining a predetermined frequency relationship between a detected signal and a reference signal. The frequency lock loop circuit includes a variable tuning circuit for adjusting its tuning frequency to generate the detected signal and a frequency comparator for comparing the frequencies of the detected and reference signals and for generating an output responsive to their frequency relationship. The frequency lock loop circuit further includes a gate module for applying repetitively and coincidentally only a predetermined portion of the detected signal and the reference signal to the frequency comparator for generating the output, and a loop circuit connecting the variable tuning circuit and the frequency comparator for applying the output to the variable tuning circuit to adjust its tuning frequency so that the predetermined frequency relationship is maintained between the detected signal and the reference signal.

In accordance with yet a further aspect the invention is directed to an RF receiver of the superregenerative type for detecting an amplitude shift keyed RF signal at a predetermined frequency. The RF receiver includes an RF amplifier for amplifying the RF signal, an RF tuning circuit connected to the RF amplifier and tuned to the RF signal at the predetermined frequency for generating a detected signal, and a quenching circuit attached to the RF tuning circuit for quenching periodically the oscillation of the RF tuning circuit. The RF receiver further includes an envelope detector connected to the RF tuning circuit for producing amplitude shift keyed data carried on the detected signal, a reference signal generator for generating a reference signal, and a loop module connected to the RF tuning circuit and the reference generator for generating a locking output in response to frequency relationship between the reference signal and the detected signal. In the RF receiver, there are provided further a frequency adjusting circuit connected to the RF tuning circuit for adjusting the predetermined frequency to lock it to the reference frequency, and a gate module for sampling the detected signal and the reference signal for a portion thereof to be inputted to the loop module for generating the locking output.

BRIEF DESCRIPTION OF THE DRAWINGS

FIG. 1 is a schematic block diagram of a known SRG receiver.

FIG. 2 shows typical shapes of waves and wave envelopes during operation of the SRG receiver shown in FIG. 1.

DETAILED DESCRIPTION OF THE INVENTION

Figure 3:
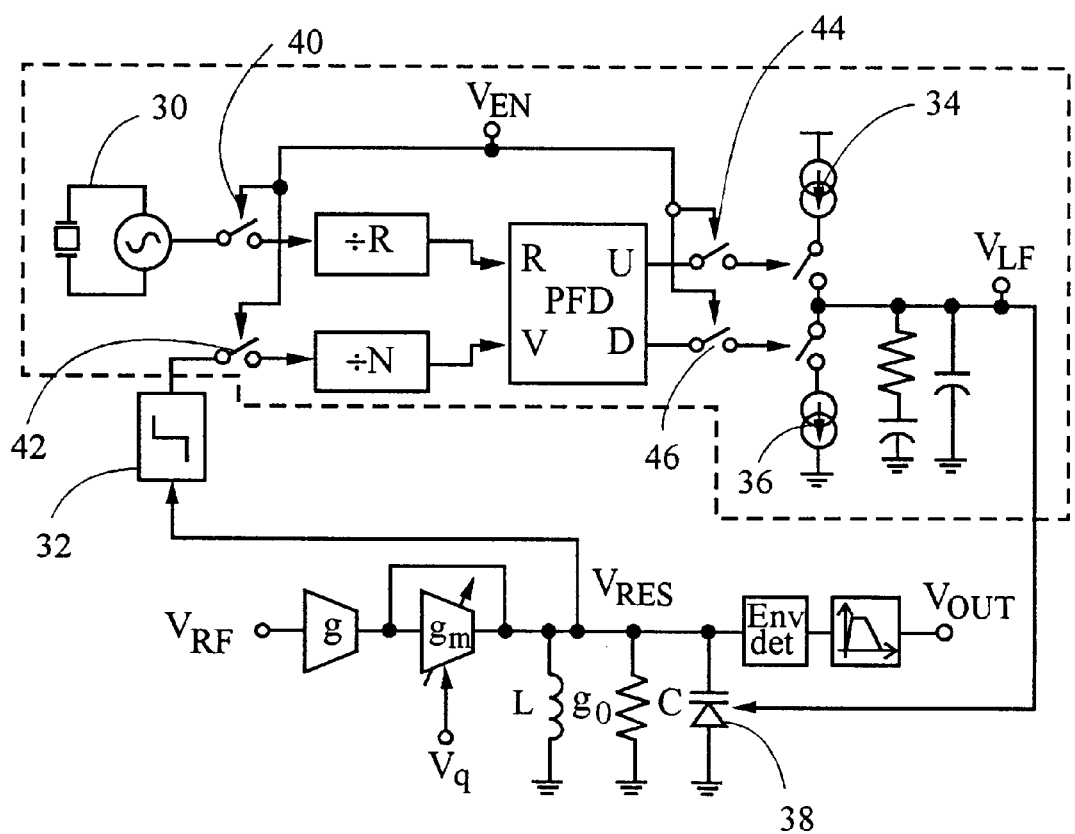
FIG. 3 is a schematic block diagram of a SRG receiver according to one embodiment of the invention.

An embodiment of the invention as applied to a SRG receiver is shown in the dashed box of FIG. 3. Frequency-locked loop (FLL) is known and it is used where frequency and/or phase synchronization must be maintained between two signals over the control bandwidth of the loop. In the figure, two signals are a reference signal and a voltage-controlled oscillator (VCO) signal. The reference signal is generated by a crystal oscillator 30 of frequency $f_{REF}$, and the VCO signal is generated by the oscillations of an unquenched SRG resonator (possibly passed through a limiting amplifier 32) with tunable resonant frequency $f_{RES}$. The VCO signal is $V_{RES}$. In some embodiments, either or both of the reference and VCO signals can be reduced in frequency by dividing by certain factors. As examples, the figure shows dividers as ÷R (divide-by-R) and ÷N (divide-by-N) blocks e.g., counters. These (and possibly divided-down) signals are connected to the inputs of a phase/frequency detector (PFD). A PFD circuit is a known circuit which compares the phases of two input signals at its R and V inputs, denoted "R" and "V" for "reference" and "VCO". If a reference rising edge precedes a VCO rising edge, an "up" pulse denoted "U" is generated at the U output, while a VCO edge preceding a reference edge generates a "down" ("D") pulse at the D output. These pulses are used to control the current sources 34 and 36 in a charge-pump circuit whose net current is applied to a loop filter (LF) which includes some kind of charge-storage element e.g., a capacitor, and generates a voltage $V_{LF}$. This loop filter voltage $V_{LF}$ is a so-called error voltage whose value is used to control the frequency of the resonator by way of a varactor 38. The combination of PFD, charge pump, and LF is connected such that the error voltage is used to bring the reference signal and VCO signal into phase synchrony. The FLL equilibrium condition can be shown to be $$\frac{f_{REF}}{R} = \frac{f_{RES}}{N} \tag{1}$$

As seen from the above equation, the resonator frequency $f_{RES}$ can be set by appropriate choice of $f_{REF}$, R and N. This equilibrium is maintained by the average frequency of the noise in the SRG receiver alone and does not require a data signal present at $V_{RF}$ to maintain frequency control of the resonator.

Referring further for FIG. 3, each ÷R and ÷N block is a digital circuit which counts positive-going transitions at its input; when the count reaches R or N, as appropriate, the block's output switches to the opposite binary state (from 0 to 1 or 1 to 0, as appropriate). Often, R and N are integer powers of two and the blocks are implemented as dividers made up of a chain of flip-flops. As described earlier, the ÷N block receives its input from the resonator signal (VCO signal or $V_{RES}$), possibly amplified by a limiter circuit, e.g., a block shown by 32. In the case of an SRG receiver, the oscillations of the resonator are periodically quenched by $V_q$ to near-zero levels, after which time they must exponentially (slowly in the beginning) build in amplitude. Therefore, for much of the period of $V_q$, resonator oscillations have neither sufficient amplitude nor regular-enough zero crossings to reliably drive the N block. It is only for some small fraction of the quench period just prior to quenching that the resonator oscillations are sufficiently large for the N block to count correctly. By contrast, the crystal always produces large fixed-amplitude oscillations with regular zero crossings, so there is no danger of the ÷R block counting incorrectly. Likewise, in cases where there is no ÷N block, the VCO signal may not have sufficient amplitude to drive PFD correctly.

According to the basic concept of the invention, the VCO signal is gated to ensure that only a portion thereof which is strong enough to drive ÷N block (or the PFD V input, in the case of no frequency division) correctly is applied to the input. The same gating must be applied to the ÷R block (or the PFD R input, in the case of no frequency division) and the outputs of the PFD for generating a proper error signal at $V_{LF}$.

The preferred embodiment of the invention shown in FIG. 3 features a coupling between the FLL enable signal $V_{EN}$ (gating signal) and the SRG resonator Q control voltage $V_q$ (VCO signal). Therefore, were it not for the gating signal $V_{EN}$, the combination of correct ÷R counting and incorrect ÷N counting (when $V_{RES}$ is too small) would cause equation (1) not to be satisfied, which in turn would result in the resonator being tuned to a frequency other than the desired one. In the invention, $V_{EN}$ is controlled such that the divider blocks count only when $V_{RES}$ is of sufficient amplitude to ensure accurate counting, which ensures the relationship in (1) holds and the resonator is tuned to the desired frequency. In this embodiment, $V_{EN}$ is asserted for a fixed period prior to the quenching of resonator oscillations, then negated at the same instant that quenching is commenced, though it is possible to negate some time prior to the start of quenching. The duty cycles of $V_{EN}$ and $V_q$ need not be related, but the periods of both signals will be the same, namely, $T_q$.

Figure 4:
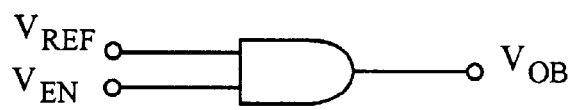
FIG. 4 is a gate circuit that can be used in an embodiment of the invention.
Figure 5:
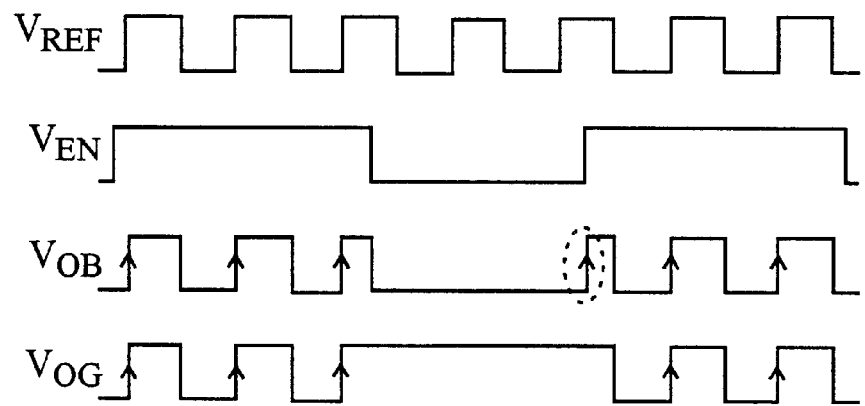
FIG. 5 is a timing diagram according to an embodiment of the invention.
Figure 6:
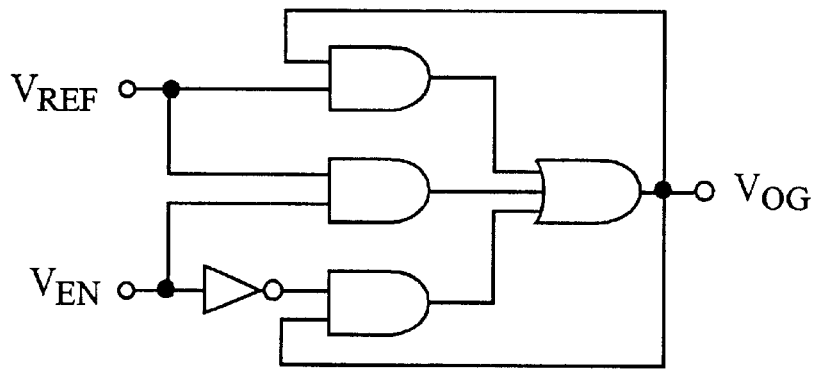
FIG. 6 is another gate circuit that can be used in an embodiment of the invention.

While the concept described above is sound, a further improvement may be possible. Referring further to FIG. 3, such improvements are described. In the embodiment of FIG. 3, no timing relationship between gating signal $V_{EN}$ and the reference voltage signal $V_{REF}$ is enforced. Thus, it is possible for $V_{EN}$ to become enabled or disabled at arbitrary phases of a cycle of $V_{REF}$. But this leads to the following subtlety: let us suppose the switch 40 which is controlled by $V_{EN}$ were a simple digital AND gate with inputs $V_{EN}$ and $V_{REF}$ and output $V_{OB}$, as shown in FIG. 4. Then under certain circumstances, it would be possible for an extra count to be erroneously registered. An example of those circumstances appears in the timing diagram of FIG. 5. If a falling edge of $V_{EN}$ occurs while $V_{REF}$ is high, and the immediately subsequent rising edge of $V_{EN}$ also occurs while $V_{REF}$ is high, then an unwanted rising edge is generated on $V_{OB}$, as shown inside the dotted ellipse in FIG. 5. This edge is unwanted because it leads to an incorrect count and hence locking to an improper frequency. One possible means to correct this error is to gate $V_{REF}$ with $V_{EN}$ such that their output resembles $V_{OG}$ as shown in FIG. 5. An example of a gating circuit which gives this behaviour is shown in FIG. 6, though this is by no means the only method to correct the problem. A circuit like FIG. 6 can be used for both the $V_{REF}$ and $V_{RES}$ switches 40 and 42 in the preferred embodiment to ensure the correct counts are obtained; however, a simple AND gate structure such as FIG. 4 will suffice for the $V_{EN}$-controlled switches 44 and 46 at the outputs of the PFD. The essential operation of the invention requires that the FLL be completely disabled when $V_{EN}$ is negated, then reenabled with the same state as that which existed during the previous enable period when $V_{EN}$ is next asserted.

Figure 7:
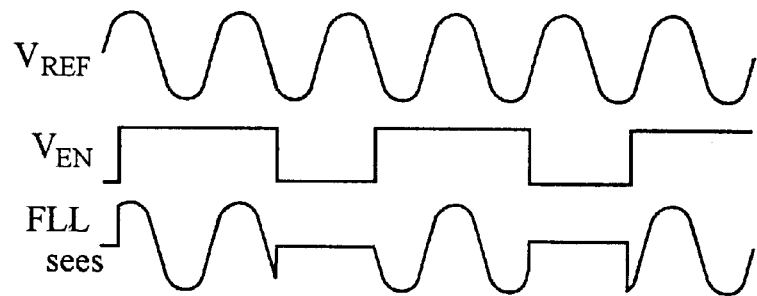
FIG. 7 shows waveforms of some signals used to describe the invention.

It was noted earlier that the invention is not required to have $f_q$, the frequency of $V_q$, to be related to any of the quantities $f_{ref}$, $f_{REF}/R$, $f_{RES}$, or $f_{RES}/N$. It might appear that this will, under certain conditions, make it impossible for the loop to lock properly because phase continuity is lacking. Although the reference signal is likely to be a square wave, for the moment consider it as a sinusoidal wave so that its division into 360° of phase is more apparent. In FIG. 7 depicted is a sinusoidal reference signal and binary $V_{EN}$ gating signal. Because the FLL is disabled when $V_{EN}$ is deasserted, $V_{EN}$ may be considered as chopping the reference voltage waveform $V_{REF}$ as depicted in the bottom diagram (it does the same to the resonator voltage $V_{RES}$). From the FLL's perspective, both reference and resonator voltages appear as a series of segments of continuous waves, and as shown in FIG. 7, there is no guarantee that the phase of either signal is the same from the end of one enable period to the start of the next. Even if $V_{REF}$ and $V_{EN}$ were forced into phase continuity by generating them from the same voltage source, there would still be timing jitter, noise, etc., meaning that the reference phase as seen by the FLL would deviate slightly from perfectly continuous. Not only is the reference voltage phase as seen by the FLL potentially discontinuous, but the resonator voltage phase is guaranteed to be discontinuous in an SRG receiver. When RF input data is absent, resonator oscillations start through thermal noise processes, which means the final oscillation will have a phase that is random and uniformly distributed over the interval $[-\pi, \pi]$ radians. When RF input data is present, the final resonator oscillation phase tends to align with that of the RF input, but sources of noise unavoidably present inside the resonator bandwidth lead to some deviation of oscillator phase compared to that of the RF input.

It is not the intent of the invention to lock perfectly to the desired frequency $f_{RF}$, but merely for the resonator to be held centered near the correct frequency with a minimum of modulation. The locking frequency is a random variable F with a probability distribution centered at $f_{RF}$ as desired and a standard deviation that is a function of a number of parameters such as the enable duty cycle, the loop filter bandwidth, the charge pump current, etc. Moreover, when $f_{RES}$ is far away from $f_{RF}$, the FLL does indeed pull the loop into lock at $f_{RF}$ as determined by equation (1). So long as $V_{EN}$ is asserted only when the resonator oscillations are of sufficient amplitude to successfully drive the ÷N block, phase discontinuity can be made not to hinder correct operation of the SRG receiver by appropriate choices of parameters. That is to say, the variance of the locking frequency $\sigma_F^2$ can be made small enough such that $f_{RF}$ is always within the passband of the resonator, and that the frequency control loop does not affect the phase of the incoming ASK signal.

In summary, the invention is distinguished from prior art by (a) the addition of an enable signal $V_{EN}$ whose value gates the inputs to the division blocks as well as the PFD outputs, (b) the sampled nature of the loop, (c) the relaxing of the requirement that input data be present (the invention works when thermal noise alone causes the oscillation), and (d) the relaxing of the usual requirement that a mirror cell be used to control the active filter. Frequency control is done on the filter while operating regardless of the presence or absence of data.

Figure 8:
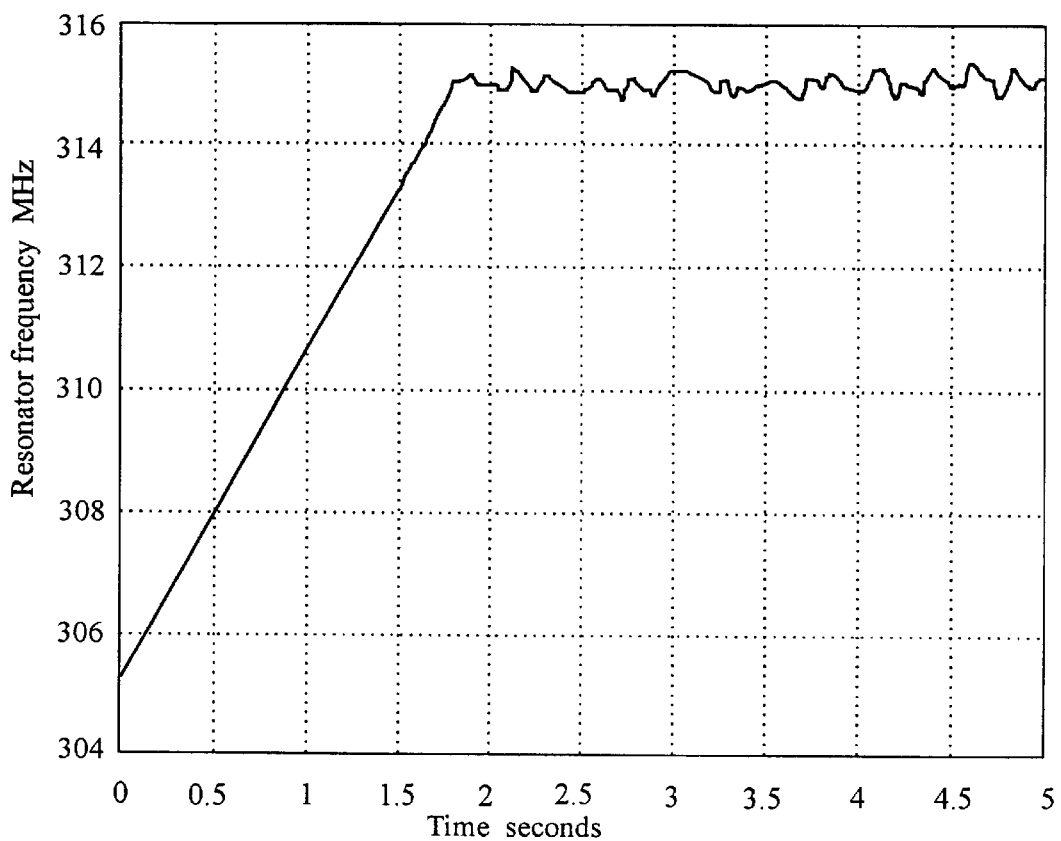
FIG. 8 is a computer simulation result of one embodiment of the invention.

FIG. 8 is a computer simulation of $f_{RES}$ as a function of time built with a special-purpose program to study the pull-in and locking behaviour of this sampled FLL. The initial frequency was 305 MHz, and $f_{REF}$=4 MHz, R=32, and N=2520 were used, meaning from (1) that the expected locking frequency is $f_{RES}$=315 MHz. $V_{EN}$ was asserted for a fraction of $T_q$ given by β=0.13, and it is seen that the loop successfully pulls into lock after about 1.8 s. The slew rate of the loop filter voltage in V/s can be shown to be given by $$SR_{LF} = \frac{\beta I_p}{2C} \quad (2)$$

where $I_p$ is the charge pump current and in the case of a so-called Type II loop filter, the kind depicted in FIG. 3, C is the sum of the small and large capacitors. For an initial frequency error, the acquisition time $t_{acq}$ can be shown to be $$t_{acq} = \frac{2 \cdot \Delta f \cdot C}{\beta \cdot I_p \cdot K_R} \quad (3)$$

where $K_R$ is the tuning gain of the resonator in MHZ/V. Finally, the jitter $\sigma_{LF}$ on the loop filter voltage after the loop achieves lock is found to be related to $$\sigma_{LF}^2 \propto \frac{I_p R_{LF} \sigma_j^{0.6}}{T_q R} V^2 \quad (4)$$

where $\sigma_j$ is the standard deviation of the time jitter on the reference frequency zero crossings and in the case of a Type II loop filter, RLF is the loop filter resistor.

Numerous modifications, variations, and adaptations may be made to the particular embodiments of the invention described above without departing from the scope of the invention, which is defined in the claims.

The embodiments of the invention in which an exclusive property or privilege is claimed are defined as follows:

1. An RF receiver of the superregenerative type for detecting an amplitude shift keyed RF signal at a predetermined frequency comprising:
   an RF amplifier for amplifying the RF signal;
   an RF tuning circuit connected to the RF amplifier and tuned to the RF signal at the predetermined frequency for generating a detected signal;
   a quenching circuit attached to the RF tuning circuit for quenching periodically the oscillation of the RF tuning circuit;
   an envelope detector connected to the RF tuning circuit for producing amplitude shift keyed data carried on the detected signal;
   a reference signal generator for generating a reference signal;
   a loop module connected to the RF tuning circuit and the reference signal generator for generating a locking output in response to frequency relationship between the reference signal and the detected signal;
   a frequency adjusting circuit connected to the RF tuning circuit for adjusting the predetermined frequency to lock it to the reference frequency; and
   a gate module for sampling the detected signal and the reference signal for a portion thereof to be inputted to the loop module for generating the locking output.

2. An RF receiver, according to claim 1, wherein the loop module further comprises frequency dividers for dividing the frequencies of the detected signal and the reference signal, and a charge storage device for generating an output charge in response to the locking output.

3. An RF receiver, according to claim 2, wherein the RF tuning circuit comprises a voltage controlled oscillator and a frequency adjusting element which is responsive to the output charge from the charge storage device.

4. An RF receiver, according to claim 2, wherein the gate module further comprises gates at the output of the loop module for sampling the locking output coincidentally with the detected signal and the reference signal.

5. An RF receiver, according to claim 1, wherein the reference and detected signals are digital in nature and the loop module further comprises a phase frequency detector and one or both of the followings:
   a ÷N divider circuit for dividing the detected signal before being applied to the phase frequency detector, and
   a ÷R divider circuit for dividing the reference signal before being applied to the phase frequency detector, wherein N and R are real numbers.

6. An RF receiver, according to claim 5 wherein the gate module further comprises gates at the output of the loop module for sampling the locking output coincidentally with the sampling of the detected and the reference signal.

7. A frequency comparison circuit for comparing frequencies of a variable signal and a reference signal comprising;
   a phase frequency detector for comparing frequencies of the variable signal and the reference signal and for generating an output that depends upon the relationship of said frequencies;
   a gate module including a first gate for gating the variable signal to be inputted to a first input of the phase frequency detector, and a second gate for gating the reference signal to be inputted to a second input of the phase frequency detector;
   an output gate module for gating the output of the phase frequency detector; and
   a control circuit, said control circuit controlling the operation of the first gate, the second gate and the output gate module so that the variable and the reference signals and the output of the phase frequency detector are gated coincidentally and repetitively for a predetermined portion thereof, the predetermined portion of the variable signal having sufficient magnitude for the operation of the phase frequency detector.

8. The frequency comparison circuit according to claim 7, wherein the phase frequency detector is a digital module for comparing the two digital signals at the first and second inputs for their frequencies and for producing and output signal either at a first output of the phase frequency detector when the frequency of one signal is larger than that of the other or at a second output of the phase frequency detector when the frequency relationship is opposite, and said output gate module includes a first output gate for gating said the first output, and a second output gate for gating said second output.

9. The frequency comparison circuit according to claim 7, further comprising a first divider module for dividing in frequency the variable signal before being inputted to the phase frequency detector, the control module circuit controlling the operation of the first gate, the second gate and the output gate module so that the variable signal, the reference signal and the output of the phase frequency detector are gated coincidentally and repetitively for a predetermined portion thereof, the predetermined portion of the variable signal having sufficient magnitude for the operation of the first divider module.

10. The frequency comparison circuit according to claim 9, further comprising a second divider module for dividing in frequency the reference signal before being inputted to the phase frequency detector.

11. The frequency comparison circuit according to claim 10, wherein the variable and reference signals are digital in nature, the first divider module including a ÷N divider circuit for dividing the variable signal before being inputted to the phase frequency detector, the second divider module including a ÷R divider circuit for dividing the reference signal before being inputted to the phase frequency detector, said N and R being real numbers.

12. A frequency lock loop circuit for maintaining a predetermined frequency relationship between a detected signal and a reference signal, comprising:
   a variable tuning circuit for adjusting its tuning frequency to generate the detected signal;
   a frequency comparator for comparing the frequencies of the detected and reference signals and for generating an output responsive to their frequency relationship;
   a gate module including a first gate circuit for gating the detected signal to be inputted to the frequency comparator, and a second gate circuit for gating the reference signal to be inputted to the frequency comparator;
   a loop circuit connecting the variable tuning circuit and the frequency comparator for applying the output to the variable tuning circuit to adjust its tuning frequency so that the predetermined frequency relationship is maintained between the detected signal and the reference signal;
   an output gate module for gating an output of the frequency comparator; and
   a control circuit, said control circuit controlling the operation of the first and second gate circuits and the output gate module so that the detected and the reference signals and the output of the frequency comparator are gated coincidentally and repetitively for a predetermined portion thereof, the detected signal having the magnitude sufficient to operate the frequency comparator during the predetermined portion.

13. A frequency comparison circuit for comparing frequencies of a variable signal and a reference signal comprising;
   a phase frequency detector for comparing frequencies of the variable signal and the reference signal and for generating an output that depends upon the relationship of said frequencies, wherein the variable and reference signals are digital in nature and the phase frequency detector is a digital module for comparing the two digital signals at its inputs for their frequencies and for producing an output signal either at a first output when the frequency of one signal is larger than that of the other or at a second output when the frequency relationship is opposite;
   gate modules at the inputs of the phase frequency detector for gating the variable signal and the reference signal so that only a portion of the variable signal and reference signal are repetitively applied to inputs of the phase frequency detector for processing;
   an output gate module comprising a first output gate connected to the first output and a second output gate connected to the second output for gating respective outputs from the phase frequency detector; and
   one or both of the following circuits:
      a ÷N divider circuit for dividing the variable signal before being inputted to the phase frequency detector, and
      a ÷R divider circuit for dividing the reference signal before being inputted to the phase frequency detector, where N and R are real numbers.

14. The frequency comparison circuit according to claim 13, further comprising;
   a charge circuit at each of the outputs of the phase frequency detector for generating electrical charges in response to the outputs of the first and second outputs, and
   an output filter connected the charge circuit for filtering the electrical charge generated thereby to produce a filter output indicative of the frequency relationship of the variable signal and the reference signal.

15. A frequency lock loop circuit for maintaining a predetermined frequency relationship between a detected signal and a reference signal, comprising:
   a variable tuning circuit for adjusting its tuning frequency to generate the detected signal;
   a reference signal generator comprising a crystal oscillator;
   a frequency comparator for comparing the frequencies of the detected and reference signals and for generating an output responsive to their frequency relationship;
   a gate module for applying repetitively and coincidentally only a predetermined portion of the detected signal and the reference signal to the frequency comparator for generating the output, the gate module comprising gate circuits for gating the detected and reference signals for only a predetermined portion of each thereof, the detected signal having the magnitude sufficient to operate the frequency comparator during the predetermined portion;
   a loop circuit connecting the variable tuning circuit and the frequency comparator for applying the output to the variable tuning circuit to adjust its tuning frequency so that the predetermined frequency relationship is maintained between the detected signal and the reference signal; and
   a detector circuit for detecting an incoming signal at a predetermined frequency to generate the detected signal, the detector circuit having the variable tuning circuit for adjusting the predetermined frequency, the detector circuit comprising a superregenerative detector having the variable tuning circuit and a quenching circuit for quenching oscillations of the variable tuning circuit,
   wherein the gate module and the quenching circuit are operated at a same repetition rate but with different duty cycles.

16. The frequency lock loop circuit according to claim 15, wherein the incoming signal is an RF signal modulated with amplitude-shift keying.

17. The frequency lock loop circuit according to claim 15 further comprising one or both of the following circuits:
   a ÷N divider circuit for dividing the detected signal before being applied to the frequency comparator, and
   a ÷R divider circuit for dividing the reference signal before being applied to the frequency comparator, wherein N and R are real numbers,
   wherein the detected and reference signals are digital in nature.

18. The frequency lock loop circuit according to claim 17, wherein the incoming signal is an RF signal modulated with amplitude-shift keying.

19. The frequency lock loop circuit according to claim 17, further comprising a control circuit for controlling the gate module so that the detected signal and the reference signal are gated for only a predetermined portion of each thereof, the detected signal having the magnitude sufficient to operate the ÷N divider circuit during the predetermined portion.

20. The frequency lock loop circuit according to claim 19, further comprising an output gate for gating the output of the frequency comparator, the control circuit controlling the gate module and the output gate so that the detected signal, the reference signal and the output of the frequency comparator are gated for only a predetermined portion of each thereof, the detected signal having the magnitude sufficient to operate the N divider circuit during the predetermined portion.

21. The frequency lock loop circuit according to claim 15, further comprising a first divider module for dividing the detected signal before being applied to the frequency comparator.

22. The frequency lock loop circuit according to claim 21, further comprising a second divider module for dividing the reference signal before being applied to the frequency comparator.

23. The frequency lock loop circuit according to claim 22, wherein the detected signal and the reference signal are digital signals, the first divider module including a first digital divider for dividing the detected signal, the second divider module including a second digital divider for dividing the reference signal.

24. The frequency lock loop circuit according to claim 15, further comprising an output gate for gating the output of the frequency comparator.

25. The frequency lock loop circuit according to claim 24, further comprising a control circuit for outputting a gate control signal to control the operation of the first gate, the second gate and the output gate.

\* \* \* \* \*